United States Patent [19]

Breit et al.

[11] Patent Number: 4,894,293

[45] Date of Patent: Jan. 16, 1990

[54] CIRCUIT SYSTEM, A COMPOSITE METAL MATERIAL FOR USE THEREIN, AND A METHOD FOR MAKING THE MATERIAL

[75] Inventors: Henry F. Breit, Attleboro; Karen A. Auguston, Brighton, both of; Joseph M. Gondusky, Warwick, R.I.

[73] Assignee: Texas Instruments Incorporated, Dallas, Tex.

[21] Appl. No.: 166,290

[22] Filed: Mar. 10, 1988

[51] Int. Cl.[4] .................................................. C22C 9/00
[52] U.S. Cl. ....................................................... 428/614
[58] Field of Search ........................................... 428/614

[56] References Cited

U.S. PATENT DOCUMENTS

| | | | |
|---|---|---|---|
| 3,097,329 | 7/1963 | Siemens | 317/234 |
| 3,220,107 | 11/1965 | Clark | 29/474.1 |
| 3,399,332 | 8/1968 | Savolainen | 317/234 |
| 4,158,719 | 6/1979 | Frantz | 428/567 |
| 4,283,464 | 8/1981 | Hascoe | 428/594 |
| 4,472,672 | 9/1984 | Spinelli et al. | 361/386 |
| 4,529,836 | 7/1985 | Powers et al. | 228/123 |
| 4,569,692 | 2/1986 | Butt | 428/618 |
| 4,680,618 | 7/1987 | Kuroda et al. | 357/74 |

FOREIGN PATENT DOCUMENTS 0093230 7/1980 Japan.

*Primary Examiner*—R. Dean
*Assistant Examiner*—David W. Schumaker
*Attorney, Agent, or Firm*—James P. McAndrews; John A. Haug; Melvin Sharp

[57] ABSTRACT

A circuit system has a semiconductor device mounted on a substrate which includes a composite metal material comprising a plurality of discrete elements of ferrous metal material such as an alloy of 36 percent nickel and the balance iron having a relatively low coefficient of thermal expansion, the discrete elements being copper-coated by electroless copper plating or the like and being pressed together and heated for sintering or diffusion-bonding the copper coatings together to form a continuous copper matrix having the discrete elements secured in dispersed relation therein for providing the composite metal material with a coefficient of thermal expansion relatively much lower than that of the copper material, the heating of the coated particles for diffusion bonding thereof being regulated for forming the continuous copper matrix while leaving the copper material of the matrix substantially free of nickel, ferrous or other constituents diffused therein from the discrete elements for providing the composite material with improved thermal conductivity.

19 Claims, 3 Drawing Sheets

CIRCUIT SYSTEM, A COMPOSITE METAL MATERIAL FOR USE THEREIN, AND A METHOD FOR MAKING THE MATERIAL

BACKGROUND OF THE INVENTION

The field of this invention is that of semiconductor circuit systems and the invention relates more particularly to a composite metal material for use in mounting semiconductor devices in such systems.

Related subject matter is disclosed in a commonly assigned copending patent application filed of even date herewith entitled A COMPOSITE MATERIAL AND METHOD FOR MAKING, Ser. No. 07/166,300 filed Mar. 10, 1988.

Conventional electronic systems employ a variety of circuit board substrates and the like for mounting semiconductor devices such as integrated circuit chips and the like. In such systems, it is known to be desirable to provide substrate materials which have coefficients of thermal expansion corresponding to those of the semiconductor devices to be mounted thereon, whereby the semiconductor devices can remain securely mounted and electrically connected to circuits on the substrates during thermal cycling of the systems. It is also known to be desirable to provide substrate materials with substantial thermal conductivity properties for dissipating heat from the semiconductor devices during operation of the devices, thereby to improve operating and reliability characteristics of the devices and systems. It is also known to employ composite metal materials in such substrates to combine relatively low coefficient of thermal expansion characteristics of one metal material with relatively high thermal conductivity characteristics of another metal material, thereby to provide composite materials having desirable combinations of coefficient of expansion and thermal conductivity properties.

For example, U.S. Pat. No. 3,399,332 provides a grid of a metal material of relatively low coefficient of thermal expansion having openings in the grid filled with a copper material or the like of relatively higher thermal conductivity to provide a mounting for a semiconductor device having a desired combination of thermal expansion and conductivity properties. In another embodiment, the patent suggests that particles of a ferrous alloy can be impregnated into a copper material for providing an alternate material having selected thermal expansion and conductivity properties. U.S. Pat. No. 4,283,464 provides two grids of a metal material of relatively low coefficient of thermal expansion on either side of an inner layer of copper metal for providing a composite substrate material having another described combination of thermal expansion and conductivity properties. U.S. Pat. No. 4,472,672 shows layer combinations of ferrous metal materials of relatively low thermal expansion properties with layer materials of relatively high thermal conductivity where the layer thicknesses are regulated to be within selected ranges for providing composite metal materials with coefficients of thermal expansion substantially corresponding to those of semiconductor devices to be mounted thereon. U.S. Pat. Nos. 3,097,329 and 4,158,719 show composite metal materials formed by powder metallurgy techniques or the like either by compacting mixtures of metal powders of relatively low coefficient of thermal expansion with metal powders of relatively high thermal conductivity materials and then heating the compacted powders for diffusion bonding the particles to each other or by compacting and sintering one of the metal powders to form a porous sintered compact and by then filling the pores of that sintered compact with a melt of the other metal material.

However each of such previously known composite metal substrate materials has been subject to some objection. Thus the composite metal materials shown in U.S. Pat. Nos. 3,399,332 and 4,283,464 are difficult to manufacture and to apply to specific circuit system applications; the composite metal material shown in U.S. Pat. No. 4,472,762 does not provide desirably high thermal conductivity in all directions; and the composite metal materials shown in U.S. Pat. Nos. 3,097,329 and 4,158,719 are not found to provide desirable combinations of thermal expansion and conductivity properties because of the manner in which they are made.

BRIEF SUMMARY OF THE INVENTION

It would be desirable if a composite metal material could be provided for use as a substrate in a semiconductor circuit system or if the composite metal material could be easily and economically manufactured and could be characterized by improved combination of thermal expansion and conductivity properties while also being characterized by improved malleability of the material for permitting easier application of the material in semiconductor circuit systems and the like.

It is an object of this invention to provide a novel and improved semiconductor circuit system; to provide such a system utilizing an improved composite metal material as a substrate for mounting semiconductor devices thereon; to provide such an improved composite metal material having improved combination of thermal expansion and thermal conductivity properties; and to provide novel and improved methods for making such materials.

Briefly described, in accordance with this invention, a plurality of discrete particles or elements of a ferrous metal alloy having a relatively low coefficient of thermal expansion are coated with a copper material having a relatively high thermal conductivity. Preferably for example particles of the ferrous alloy having a particle size in the range from about 44 microns to 425 microns are cleaned in conventional manner and are coated with a copper material in any conventional manner by electroplating or electroless copper plating or the like. If desired, the particles can be formed by cladding a fine core wire of the low expansion metal with copper and by then cutting short lengths from the wire to form the discrete elements, and if desired, the coated discrete elements can be mixed with other copper metal particles. The coated particles or elements and/or other copper particles are then pressed together in accordance with conventional powder metallurgy techniques, preferably forming a compact having a porosity of less than about 40 percent or the like, and are heated for diffusion-bonding the copper coatings, or the copper-coated portions of the discrete elements, to each other to form a continuous copper matrix having the discrete elements secured in dispersed relation therein, the heating being regulated with respect to temperature and duration to be sufficient for diffusion-bonding the copper coatings to each other while substantially avoiding diffusion of ferrous constituents or the like from the discrete elements into the copper materials. In that way, the proportion of the discrete element materials provided in the composite metal material is easily regulated with respect to the proportion of the copper material therein by regulation of the plating process or by addition of copper powders to provide the composite metal material with a selected thermal expansion coefficient, preferably in the range from about 4 PPM/°C. to 8 PPM/°C. The coatings on the elements are also easily bonded together with each other, or with copper powders, in a reliable and secure manner for forming the desired composite metal material while retaining the high thermal conductivity characteristics of the copper material in the composite and without introducing any substantial diffusion of nickelous, ferrous, or other materials from the discrete elements into the copper materials such as would substantially reduce the thermal conductivity of the copper materials. In that arrangement, the composite metal material is adapted to display substantial malleability and the semiconductor devices are easily mounted on substrates formed of the composite metal materials of this invention for providing improved semiconductor circuit systems.

DESCRIPTION OF THE DRAWINGS

Other objects, advantages and details of the novel and improved circuit system, composite metal materials, and methods of this invention appear in the following detailed description of preferred embodiments of the invention, the detailed description referring to the drawings in which.

DESCRIPTION OF THE PREFERRED EMBODIMENTS

Figure 1:
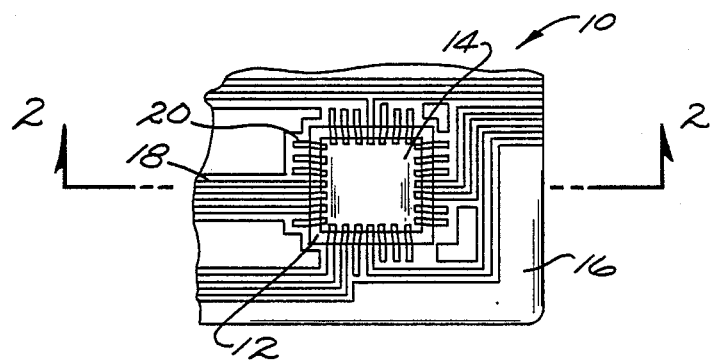
FIG. 1 is a plan view of a circuit system of this invention.
Figure 2:
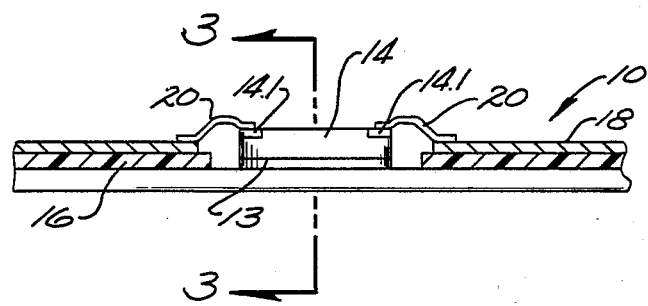
FIG. 2 is a section view along line 2—2 of the circuit system of FIG. 1.

Referring to the drawings, 10 in FIG. 1 indicates the novel and improved circuit systems of this invention which is shown to include a substrate 12 (not sectioned in FIG. 2) having a semiconductor device 14 such as a conventional integrated circuit chip or the like secured by a thermally and electrically conductive epoxy material or by a tin-lead solder material 13, or by an electrically conducting or nonconducting epoxy or the like, to the substrate. Typically the substrate is selectively coated with an electrically insulating material 16 and has electrically conductive circuit paths 18 formed on the electrical insulating coating in any conventional manner, the semiconductor device having selected terminals 14.1 thereof electrically connected to selected circuit paths 18 on the substrate by wire-bond leads 20 or in any other conventional manner.

Figure 3:
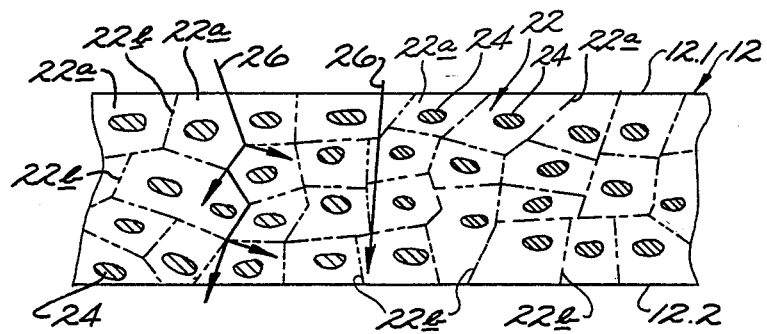
FIG. 3 is a partial section view to greatly enlarged scale along line 3—3 of FIG. 2 illustrating the composite metal material of this invention.

In accordance with this invention, the substrate 12 as best shown in FIG. 3 comprises a composite metal material including a continuous matrix 22 of a first metal material having a plurality, and preferably a great multiplicity, of discrete elements 24 of other metal materials secured in dispersed relation therein. Preferably the discrete elements embody ferrous metal materials having relatively low coefficient of thermal expansion relative to the noted matrix material for cooperating with the continuous matrix material to provide the composite metal material 12 with a selected coefficient of thermal expansion which is relatively much lower than the thermal expansion properties of the continuous matrix material. Preferably the continuous matrix material 22 comprises a copper material having a relatively high thermal conductivity characteristic as compared to the materials of the discrete elements 24 and the matrix material is substantially free of ferrous metal or other alloying constituents such as might tend to lower the thermal conductivity of the copper matrix material. In that arrangement, the discrete elements 24 are dispersed throughout the composite metal material and define a plurality of relatively high heat conductivity paths which are both serpentine and/or direct as indicated at 26 in FIG. 3 passing between, the plate surfaces 12.1 and 12.2 of the composite metal material. Preferably as shown in FIG. 3, the size of the discrete elements is such that the thickness of the composite metal material between surfaces 12.1 and 12.2 accommodates many of the particles or discrete elements 24 along a path between those surfaces, approximately 4 being shown in FIG. 3.

In a preferred method for making the composite metal material 12 in accordance with this invention, the discrete elements 24 preferably comprise particles of ferrous metal alloys selected from a group consisting of alloys having nominal compositions by weight of about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum and the balance iron, of about 57 percent cobalt, 9 percent chromium and the balance iron, and of about 23 to 30 percent nickel, about 17 to 30 percent cobalt, about 0.6 to 0.8 percent manganese and the balance iron. Such discrete element particles are preferably formed in any conventional manner by atomizing or the like and are provided with particle sizes in the range from 44 to 425 micron diameter for providing the composite metal material 12 with desired malleability. The particles are deposited as diagrammatically indicated at 27 in FIG. 4 on a carrier mechanism as is diagrammatically illustrated at 28 in FIG. 4 to be advanced for cleaning the particles in any conventional manner.

Figure 4:
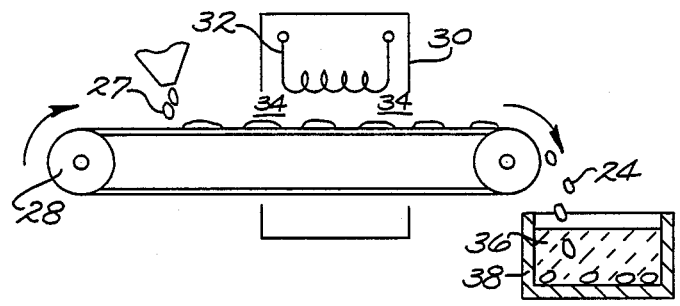
FIG. 4 is a diagrammatic view illustrating steps in the method of this invention.

Typically for example the particles are advanced through an oven diagrammatically indicated at 30 in FIG. 4 wherein the particles are cleaned by heating as indicated at 32 in a reducing atmosphere of hydrogen or the like indicated at 34 for removing surface oxides and greases and the like from the particles. Alternately the particles are cleaned in any other conventional manner in accordance with this invention.

In a preferred embodiment of this invention, the particles 24 are then introduced into an electroless copper plating bath 36 for a selected period of time for coating the particles 24 with a copper material 22a or the like as shown in FIG. 4. Preferably for example, a conventional aqueous electroless copper plating bath 36 is prepared comprising metal salts and reducing agents in water at a temperature on the order of 25° to 70° C. in concentration of about 15 grams per liter. The particles 24 are introduced into the bath in a container 38 by means of a screen basket or the like (not shown) and are agitated thereon as indicated by arrow 40 in FIG. 4 for 30–80 minutes to provide the particles 24 with coatings 22a corresponding in volume to about 30 to 50 percent of the volume of the coated particles. The particles are preferably introduced into the bath at a temperature of about 25° C. and the bath is continuously supplemented to maintain the concentration of the bath as the particles are plated therein, whereby the particles are each coated with a desired copper material around all surfaces of the particles. In that arrangement, the copper coating provided on the particles preferably comprises a copper material such as a substantially pure copper or the like preferably having a thermal conductivity on the order of about 9.9 watts/in./°C. As the method for electroless copper plating the particles herein is conventional it is not further described herein and it will be understood that any conventional electroless copper plating of the particles 24 is within the scope of this invention.

In alternate embodiments of this invention, the copper coating 22a of the particles 24 as provided in the bath indicated at 36 in FIG. 4 are applied by electrolytic plating of the particles or in any other conventional manner.

Figure 5:
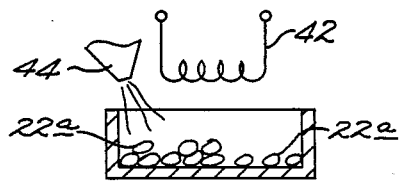
FIG. 5 is a diagrammatic view illustrating a subsequent step in the method of this invention.
Figure 6:
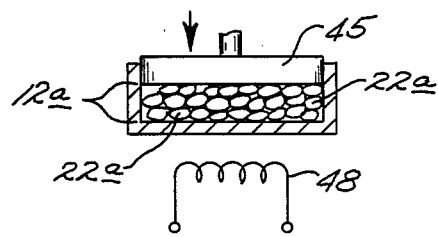
FIG. 6 is a diagrammatic view illustrating another step in the method of this invention.

In the preferred method of this invention the discrete particles 24 with the coatings 22a are dried by brief heating or the like as diagrammatically indicated at 42 in FIG. 5 and/or by blow drying or the like as diagrammatically indicated at 44 in FIG. 5. The dry, coated particles are then pressed together by pressing means 45, preferably with a force in the range from 2,000 to 100,000 psi or the like, in any conventional manner commonly employed in powder metallurgy to form a compact 12a as indicated in FIG. 6, the powder compact then being heated in any conventional manner as diagrammatically indicated at 48 in FIG. 6 for diffusion-bonding copper coatings 22a of the particles along interfaces as indicated at 22b in FIG. 3 to form the continuous copper matrix 22 having the discrete particles or elements 24 secured in dispersed relation therein. The heating for this diffusion-bonding is regulated to be adequate for accomplishing the desired diffusion-bonding of the copper coatings to each other while leaving the copper materials of the coatings substantially free of diffusion of ferrous metal constituents from the materials of the discrete particles into the copper such as might significantly reduce the thermal conductivity of the copper materials below about 70 percent of pure copper or about 7 watts/in./°C. Preferably the thermal conductivity of the copper is retained at 8 watts/in./°C. or better.

In accordance with preferred embodiments of this invention, the copper coatings 22a formed on the discrete elements 24 constitute from about 30 to 50 percent of the volume of the coated particles so that the continuous copper matrix 22 formed in the composite metal material comprises from 30 to 50 percent of the volume of the composite material. Preferably the materials and the coating thicknesses of the coated particles are selected so that the materials of the particles and the coatings cooperate in providing the composite metal material 12 with a coefficient of thermal expansion in the range from about 4 PPM/°C. to 8 PPM/°C. and with an effective thermal conductivity between surfaces 12.1 and 12.2 of the composite metal material in the range from about 2.5 watts/in./°C. to about 5.0 watts/in./°C.

In a preferred embodiment of the invention for example, the discrete particles 24 comprise a ferrous metal alloy having a nominal composition by weight of 36 percent nickel and the balance iron and are provided in a size range from 45 to 425 microns. The particles are cleaned by reduction in hydrogen and are electroless copper plated as in the bath noted above for providing the particles with copper coating constituting 40 percent of the volume of the coated particles. The particles are blown dry in nitrogen and compacted in conventional manner with a force of 2,000 to 100,000 psi or the like to form a compact having a porosity of less than about 40 percent and are heated to a temperature of less than about 850° C., and preferably to a temperature in the range from 600° to about 850° C., for 1 to 20 minutes to form a substantially pore-free composite metal material 12 having a continuous copper matrix 22 substantially free of ferrous metal diffusions therein from the discrete elements. In that arrangement, the composite metal material will display a coefficient of thermal expansion on the order of 7 PPM/°C. and a thermal conductivity on the order of 3.5 watt/in./°C. and will display substantial malleability for permitting rolling reduction of the thickness of the composite metal materials, preferably in the range from 0.005 to 0.060 inches, to facilitate application of the composite metal materials in making substrates for circuit systems 10 as above described.

Figure 7:
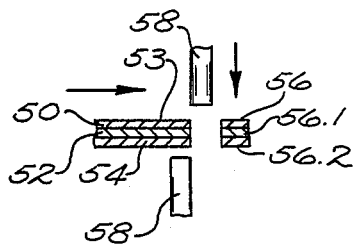
FIG. 7 is a diagrammatic view illustrating a step in an alternate method of this invention.
Figure 8:
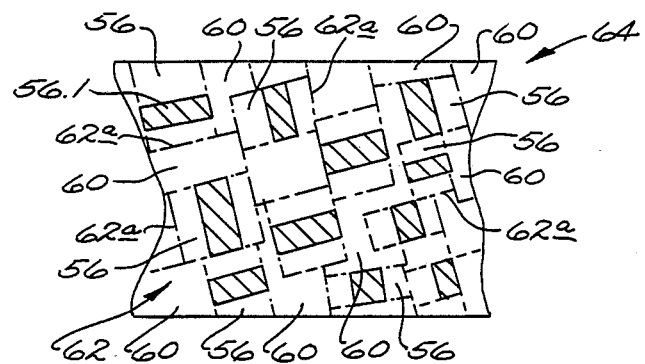
FIG. 8 is a section view to enlarged scale similar to FIG. 3 illustrating an alternate embodiment of the composite metal material of this invention.

In an alternate embodiment of the invention as shown in FIGS. 7 and 8, a clad metal wire 50 of round cross sectional configuration as is shown in FIG. 7, having a core 52 of one of the above-noted ferrous metal materials of relatively low coefficient of thermal expansion and having a cladding 53 of copper metal of relatively high purity such as an OFHC or ETP copper or the like metallurgically bonded, preferably in the solid phase in any conventional manner to the core along the circumferential core-cladding interface 54, is severed into short lengths or fibers to form the coated discrete elements 56 having core portions 56.1 and cladding portions 56.2 using any conventional cutting or blanking means as indicated diagrammatically at 58 in FIG. 7. A plurality or multiplicity of those discrete elements corresponding in many respects to the discrete elements 24 previously described are then cleaned if desired, are compacted together with each other with or without addition of other copper metal powder 60 and are heated in the manner previously described so that the copper coating surfaces of the discrete elements 56 and the copper powder are diffusion-bonded together with each other for forming a continuous copper matrix 62 and for securing the discrete element cores 56.1 in dispersed relation therein to form the composite metal material 64, the cores cooperating with the copper matrix in providing the composite metal material with an effective coefficient of thermal expansion relatively much lower than that of the copper material as above described. In that arrangement, the heating for diffusion-bonding is regulated to be high enough to diffusion-bond the copper coatings to each other, and to the copper powders if used, along the interfaces indicated at 62a in FIG. 8 for forming a substantially pore-free composite metal while substantially avoiding diffusion of nickel, iron or other materials from the core elements 56.1 into the copper materials such that the copper materials themselves preferably retain a thermal conductivity on the order of 8 watts/in./°C. or better as described above while also achieving desired effective thermal expansion coefficients in the composite material.

It should be understood that although particular embodiments of the systems, materials and methods of this invention have been described by way of illustrating the invention, this invention includes all modifications and equivalents of the described embodiments falling within the scope of the appended claims.

I claim:

1. A composite metal material comprising a continuous matrix of a first metal material securing a plurality of discrete elements of other metal materials in dispersed relation therein, the discrete elements embodying ferrous metal materials having relatively low coefficient of thermal expansion for cooperating with the continuous matrix material to provide the composite metal material with a selected coefficient of thermal expansion relatively much lower than that of the continuous matrix material, characterized in that the continuous metal matrix material comprises a copper material of relatively high thermal conductivity substantially free of ferrous metal constituents therein for providing the composite metal material with an improved effective thermal conductivity between opposite surfaces of the composite metal material.

2. A composite metal material comprising a continuous matrix of a first metal material having a multiplicity of discrete elements of other metal materials secured in dispersed relation therein, the discrete elements embodying ferrous metal materials having relatively low coefficient of thermal expansion selected from the group of alloys having nominal compositions by weight of about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese, and the balance iron for cooperating with the continuous matrix material to provide the composite metal material with a selected coefficient of thermal expansion relatively much lower than that of the continuous matrix material, and the continuous matrix material comprising a copper material substantially free of ferrous metal constituents which secures said discrete elements in said dispersed relation and which has relatively high thermal conductivity greater than about 8 watts/in./° C. for providing the composite metal material with improved thermal conductivity between opposite surfaces of the composite metal material.

3. A composite metal material according to claim 2 further characterized in that the discrete elements embody an alloy having a nominal composition by weight of about 36 percent nickel and the balance iron, the discrete elements comprise from about 50 to 70 percent by volume of the composite metal material for providing the composite metal material with a coefficient of thermal expansion in the range from 4 PPM/° C. to 8 PPM/° C., and with a thermal conductivity through the composite metal material in the range from 2.5 to 5 watts/in./° C.

4. A composite metal material according to claim 3 further characterized in that the discrete elements comprise about 60 percent by volume of the composite metal material for providing the composite metal material with a coefficient of thermal expansion of about 7 PPM/° C. and an effective thermal conductivity through the composite metal material of about 3.5 watts/in./°C.

5. A composite metal material comprising a plurality of discrete elements of ferrous metal materials of relatively low coefficient of thermal expansion having coated portions thereon of a copper material of relatively high thermal conductivity, the copper coated portions being diffusion-bonded to each other forming a continuous matrix of the copper material securing the discrete elements in dispersed relation therein to provide the composite metal material with a selected coefficient of thermal expansion relatively much lower than that of the copper material, the diffusion-bonded copper coatings being substantially free of metal constituents diffused therein from the discrete elements for providing the composite metal material with improved thermal conductivity through the composite metal material.

6. A composite metal material according to claim 5 wherein the discrete elements embody ferrous metal materials selected from the group consisting of alloys having nominal compositions by weight of about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 16.5 percent chromium, 4.5 percent aluminum and the balance iron, of about 57 percent cobalt, 9 percent chromium and the balance iron, and of about 23 to 30 percent nickel, about 17 to 30 percent cobalt, about 0.6 to 0.8 percent manganese and the balance iron and the copper material has a thermal conductivity of at least about 8 watts/in./° C.

7. A composite metal material according to claim 6 wherein the discrete elements embody an alloy having a nominal composition by weight of about 36 percent nickel and the balance iron and the discrete elements comprise from about 50 to 70 percent by volume of the composite metal material for providing the composite metal material with a coefficient of thermal expansion in the range from 4 PPM/°C. to 8 PPM/°C. and with a thermal conductivity through the composite metal material in the range from 2.5 watts/in./°C. to 5 watts/in./°C.

8. A composite metal material according to claim 7 wherein the discrete elements comprise 60 percent by volume of the composite metal material for providing the composite metal material with a coefficient of thermal expansion of about 7 PPM/°C. and a thermal conductivity through the composite metal material of about 3.5 watts/in./°C.

9. A composite metal material produced by the process of providing a plurality of discrete elements of ferrous metal material having relatively low coefficient of thermal expansion and having portions of the discrete elements coated with another metal material of relatively high thermal conductivity, pressing the coated elements together and heating the coated elements for diffusion-bonding the coated portions of the elements together to form a continuous matrix of the material having the discrete elements secured in dispersed relation therein for forming the composite metal material, the heating being regulated to substantially avoid diffusion of ferrous constituents from the materials of the discrete elements into the copper material such as would significantly reduce the thermal conductivity of the copper material.

10. A composite metal material according to claim 9 wherein the coated elements are heated to a temperature less than about 850° C. for diffusion-bonding the coated elements together to form said continuous matrix free of substantial diffusion of ferrous constituents from the discrete elements into the copper material to provide improved thermal conductivity in a composite metal material.

11. A composite metal material according to claim 10 wherein the coated elements are heated to a temperature in the range from 600° to 850° C. for diffusion-bonding thereof.

12. A composite metal material according to claim 9 wherein the discrete elements are coated with said copper material by electroless copper plating.

13. A composite metal material according to claim 9 wherein the discrete elements embody ferrous metal materials selected from the group consisting of alloys having nominal compositions by weight of about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum and the balance iron, of about 57 percent cobalt, 9 percent chromium and the balance iron, and of about 23 to 30 percent nickel, about 17 to 30 percent cobalt, about 0.6 to 0.8 percent manganese and the balance iron, the discrete elements are coated with said copper materials by electroless copper plating, and the coated elements are heated to a temperature less than about 850° C. for diffusion-bonding the coated elements together to form said continuous matrix free of substantial diffusion of ferrous constituents from the discrete elements into the copper material to provide improved thermal conductivity in the composite metal material.

14. A composite metal material according to claim 13 wherein the coated elements are heated to a temperature in the range from about 600° to 850° C. for diffusion-bonding the coated elements together.

15. A composite metal material according to claim 13 wherein the discrete elements embody an alloy having a nominal composition by weight of about 36% nickel and the balance iron, the discrete elements comprise from about 50 to 70 percent by volume of the composite metal material for providing the composite metal material with a coefficient of thermal expansion in the range from 4 PPM/°C. to 8 PPM/°C., and the copper material in the continuous metal matrix has a thermal conductivity greater than about 8 watts/in./°C. for providing the composite metal material with a thermal conductivity through the composite metal material with a range from 2.5 watts/in./°C. to 5 watts/in./°C.

16. A composite metal material according to claim 15 wherein the discrete elements have a particle size in the range from 45 to 425 microns for providing the composite metal material with substantial malleability.

17. A composite metal material according to claim 16 wherein the discrete elements comprise about 60 percent by volume of the composite metal material for providing the composite metal material with a coefficient of thermal expansion of about 7 PPM/°C. and with a thermal conductivity of about 3.5 watts/in./°C.

18. A composite metal material according to claim 9 wherein the discrete elements comprise fibers having cores of said ferrous metal material clad with copper metallurgically bonded thereto.

19. A circuit system comprising a semiconductor device having a selected coefficient of thermal expansion, and a substrate mounting the semiconductor device, the substrate having a coefficient of thermal expansion substantially corresponding to said selected coefficient of thermal expansion for reliably mounting the semiconductor device thereon during operation of the device and having sufficient thermal conductivity for dissipating heat from the semiconductor device for permitting reliable operation of the device mounted on the substrate, the substrate including a composite metal material comprising a continuous matrix of a first metal material having a plurality of discrete elements of other metal materials secured in dispersed relation therein, characterized in that the discrete elements embody ferrous metal materials having relatively low coefficient of thermal expansion for cooperating with the continuous matrix material to provide the composite metal material with a selected coefficient of thermal expansion relatively much lower than that of the continuous matrix material, and the continuous matrix material. comprises a copper material of relatively high thermal conductivity substantially free of ferrous metal constituents therein for providing the composite metal material with improved thermal conductivity through the composite metal material.

* * * * *